United States Patent
Albrecht et al.

(10) Patent No.: US 6,947,235 B2
(45) Date of Patent: Sep. 20, 2005

(54) PATTERNED MULTILEVEL PERPENDICULAR MAGNETIC RECORDING MEDIA

(75) Inventors: Manfred Albrecht, Isny-Rohrdorf (DE); Olav Hellwig, Berlin (DE); Guohan Hu, Campbell, CA (US); Bruce David Terris, Sunnyvale, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 0 days.

(21) Appl. No.: 10/727,826

(22) Filed: Dec. 3, 2003

(65) Prior Publication Data

US 2005/0122609 A1 Jun. 9, 2005

(51) Int. Cl.[7] .................................................. G11B 5/02
(52) U.S. Cl. ........................... 360/55; 360/59; 360/131
(58) Field of Search ........................... 360/55, 59, 131, 360/135; 428/131, 212, 64.3, 65.5, 65.3

(56) References Cited

U.S. PATENT DOCUMENTS

| | | | |
|---|---|---|---|
| 3,655,441 A | | 4/1972 | Kefalas |
| 5,436,448 A | | 7/1995 | Hosaka et al. |
| 5,458,987 A | * | 10/1995 | Sato et al. ............ 428/694 EC |
| 5,583,727 A | | 12/1996 | Parkin |
| 5,804,710 A | | 9/1998 | Mamin et al. |
| 5,820,769 A | * | 10/1998 | Chou .......................... 216/22 |
| 5,844,755 A | * | 12/1998 | Yamane et al. ............. 360/131 |
| 5,900,728 A | | 5/1999 | Moser et al. |
| 5,900,729 A | | 5/1999 | Moser et al. |
| 6,011,664 A | | 1/2000 | Kryder et al. |
| 6,171,676 B1 | * | 1/2001 | Mukai et al. ............... 428/65.3 |
| 6,174,597 B1 | * | 1/2001 | Yusu et al. .................. 428/332 |
| 6,331,364 B1 | | 12/2001 | Baglin et al. |
| 6,383,597 B1 | | 5/2002 | Fullerton et al. |
| 6,391,430 B1 | * | 5/2002 | Fullerton et al. ............ 428/212 |
| 6,421,195 B1 | * | 7/2002 | Rubin et al. ................... 360/48 |
| 6,493,183 B1 | | 12/2002 | Kasiraj et al. |
| 6,660,357 B1 | * | 12/2003 | Litvinov et al. ............ 428/65.3 |
| 6,737,172 B1 | * | 5/2004 | Girt ........................... 428/611 |
| 6,754,017 B2 | * | 6/2004 | Rettner et al. ................. 360/51 |
| 6,865,044 B1 | * | 3/2005 | Albrecht et al. .............. 360/59 |
| 6,882,488 B1 | * | 4/2005 | Albrecht et al. .............. 360/55 |
| 2002/0037439 A1 | | 3/2002 | Lilvinov et al. |
| 2003/0021191 A1 | | 1/2003 | Hsu et al. |
| 2003/0091865 A1 | | 5/2003 | Chen et al. |
| 2003/0107833 A1 | | 6/2003 | Rattner et al. |
| 2004/0080847 A1 | * | 4/2004 | Lundstrom .................... 360/46 |
| 2004/0265639 A1 | * | 12/2004 | Hintz et al. ............... 428/694 T |

OTHER PUBLICATIONS

R. L. White et al., "Patterned Media: A Viable Route to 50 Gbit/in2 and Up for Magnetic Recording?", IEEE Transactions on Magnetics, vol. 33, No. 1, Jan. 1997, 990–995.

C. Chappert, et al., "Planar Patterned Magnetic Media Obtained by Ion Irradiation," Science, vol. 280, Jun. 19, 1998, pp. 1919–1922.

E. Eleftheriou et al., "Millipede–A MEMS–Based Scanning– Probe Data–Storage System", IEEE Transactions on Magnetics, vol. 39, No. 2, Mar. 2003, pp.938–945.

(Continued)

*Primary Examiner*—David Hudspeth
*Assistant Examiner*—Dismery Mercedes
(74) *Attorney, Agent, or Firm*—Thomas R. Berthold

(57) ABSTRACT

A patterned perpendicular magnetic recording medium has magnetic islands that contain stacks of individual magnetic cells to provide multilevel recording. Each cell in an island is formed of a material or set of materials to provide the cell with perpendicular magnetic anisotropy and is a single magnetic domain. Each cell is magnetically decoupled from the other cells in its island by nonmagnetic spacer layers. Thus each cell can have a magnetization (magnetic moment) in one of two directions (into or out of the plane of the layer making up the cell), and this magnetization is independent of the magnetization of the other cells in its island. This permits multiple magnetic levels or states to be recorded in each magnetic island.

36 Claims, 7 Drawing Sheets

OTHER PUBLICATIONS

M. Kleiber et al., "Magnetization switching of submicrometer Co dots induced by a magnetic force microscope tip", Phys Rev B, vol. 58, No. 9, Sep. 1, 1998, pp. 5563–5567.

J. Lohau et al. "Writing and reading perpendicular magnetic recording media patterned by a focused ion beam", Appl Phys Lett, vol. 78, No. 7, Feb. 12, 2001, pp. 990–992.

B. Cui et al. "Perpendicular quantized magnetic disks with 45 Gbits on a 4x4 cm2 area", J Appl Phys, vol. 85, No. 8, Apr. 15, 1999, pp. 5534–5536.

Haginoya C. et al., "Thermomagnetic writing on 29 Gbit/in.(2) patterned magnetic media", Appl Phys Lett 75 (20): 3159–3161 Nov. 15, 1999.

Castano F. wt et al., "Magnetic force microscopy and x-ray scattering study of 70x550 nm(2) pseudo-spin-valve nanomagnets", J Appl Phys 93 (10): 7927–7929 Part 3 May 15, 2003.

Todorovic M., "Writing and reading of single magnetic domain per bit perpendicular patterned media", Appl Phys Lett 74 (17): 2516–2518 Apr. 26, 1999.

Ross C., "Patterned magnetic recording media", Annu Rev Mater Res 31: 203–235 2001.

A. Dietzel et al., "Ion Projection Direct Structuring for Patterning of Magnetic Media", IEEE Transactions on Magnetics, vol. 38, No. 5, Sep. 2002, pp. 1952–195.

* cited by examiner

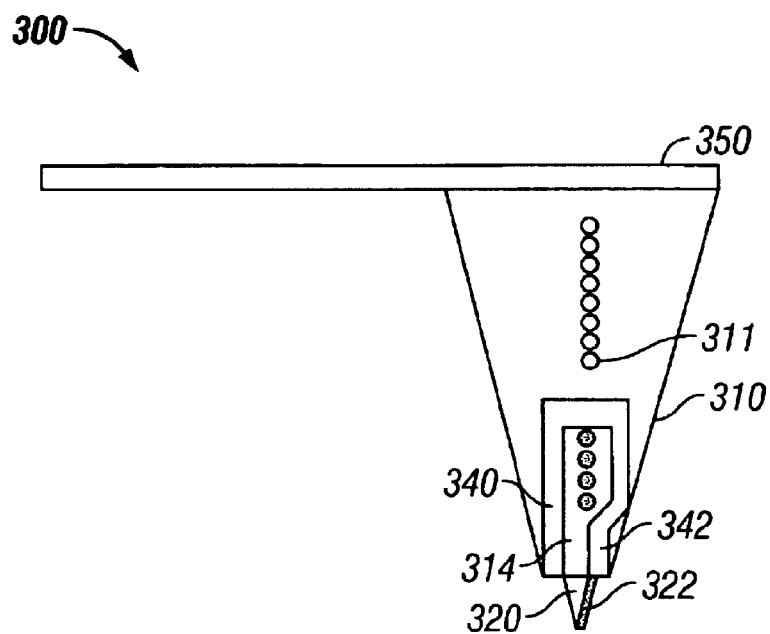
FIG. 7
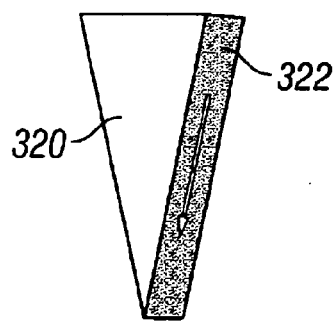
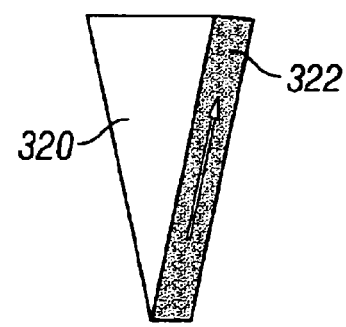
FIG. 8(a)          FIG. 8(b)

PATTERNED MULTILEVEL PERPENDICULAR MAGNETIC RECORDING MEDIA

RELATED APPLICATIONS

This application is related to the following applications, all of which are based on a common specification:

"MAGNETIC RECORDING SYSTEM WITH PATTERNED MULTILEVEL PERPENDICULAR MAGNETIC RECORDING MEDIA" application Ser. No. 10/727,812 filed Dec. 3, 2003; and "METHOD FOR MAGNETIC RECORDING ON PATTERNED MULTILEVEL PERPENDICULAR MEDIA USING VARIABLE WRITE CURRENT" application Ser. No. 10/727,812 filed Dec. 3, 2003; and "METHOD FOR MAGNETIC RECORDING ON PATTERNED MULTILEVEL PERPENDICULAR MEDIA USING THERMAL ASSISTANCE AND FIXED WRITE CURRENT" application Ser. No. 10/728,213 Dec. 3, 2003.

TECHNICAL FIELD

This invention relates to magnetic recording media and systems, such as magnetic recording hard disk drives, and more particular to media and systems with patterned perpendicular magnetic recording media.

BACKGROUND OF THE INVENTION

Patterned magnetic recording media have been proposed to increase the bit density in magnetic recording data storage, such as hard disk drives. In patterned media, the magnetic material is patterned into small isolated blocks or islands such that there is a single magnetic domain in each island or "bit". The single magnetic domains can be a single grain or consist of a few strongly coupled grains that switch magnetic states in concert as a single magnetic volume. This is in contrast to conventional continuous media wherein a single "bit" may have multiple magnetic domains separated by domain walls. U.S. Pat. No. 5,820,769 is representative of various types of patterned media and their methods of fabrication. A description of magnetic recording systems with patterned media and their associated challenges is presented by R. L. White et al., "Patterned Media: A Viable Route to 50 Gbit/in$^2$ and Up for Magnetic Recording?", *IEEE Transactions on Magnetics*, Vol. 33, No. 1, January 1997, 990–995.

Patterned media with perpendicular magnetic anisotropy have the desirable property that the magnetic moments are oriented either into or out of the plane, which represent the two possible magnetization states. It has been reported that these states are thermally stable and that the media show improved signal-to-noise ratio (SNR) compared to continuous (unpatterned) media. However, to achieve patterned media with a bit density of 1 Terabit/in$^2$, a nanostructure array with a period of 25 nm over a full 2.5 inch disk is required. Even though fabrication methods supporting bit densities of up to 300 Gbit/in$^2$ have been demonstrated, large area ultra-high density magnetic patterns with low defect rates and high uniformity are still not available.

The use of multiple level (multilevel) magnetic storage has been proposed, as described in U.S. Pat. No. 5,583,727, but only for continuous (unpatterned) magnetic films and not patterned magnetic islands. However, in multilevel continuous magnetic films the number of magnetic grains, and hence the signal and noise, is divided into the multiple levels, and hence the SNR is degraded.

What is needed is a magnetic recording media and system that takes advantage of both patterned media and multilevel recording.

SUMMARY OF THE INVENTION

The invention is a patterned perpendicular magnetic recording medium where each magnetic block or island contains a stack of individual magnetic cells. Each cell in an island is formed of a material or set of materials to provide the cell with perpendicular magnetic anisotropy and is a single magnetic domain. Each cell is magnetically decoupled from the other cells in its island by nonmagnetic spacer layers. Thus each cell can have a magnetization (magnetic moment) in one of two directions (into or out of the plane of the layer making up the cell), and this magnetization is independent of the magnetization of the other cells in its island. Therefore the total magnetization integrated over the different cells per island permits multiple magnetic signal levels or states to be recorded in each magnetic island. Because each cell in each island is a single magnetic domain, there is no increase in noise due to the multiple magnetic levels. The number n of magnetic cells stacked in the islands give rise to $2^n$ different readback signal levels. The recording density is thus increased by a factor of $2^{(n-1)}$.

Each cell in an island has a magnetic coercivity different from the coercivity of the other cells in its island. The magnetic cells can be written (have their magnetizations switched) by an inductive write head capable of writing with multiple write currents, each write current providing a different magnetic write field. Application of a write field greater than the coercivity of only some of the cells but less than the coercivities of the other cells writes just those selected cells in the island. Application of a write field greater than the coercivity of the highest coercivity cell writes all of the cells in the island. The magnetic cells can also be written with thermal assistance by an inductive write head with a fixed write current that provides only a single magnetic write field. Application of the write field without thermal assistance writes only the lower coercivity cell. Application of the same write field but with thermal assistance will write all the cells in the island that have had their temperature raised to close to their Curie temperature because the coercivity of those cells will be below the write field.

The magnetic islands are spaced apart on the substrate by voids or material that does not affect the magnetic properties of the cells and that does not adversely affect writing to the cells. The substrate can be a magnetic recording disk substrate with the islands patterned in concentric tracks or a substrate of the type used in probe-based array storage systems with the islands patterned in an x-y pattern of mutually perpendicular rows.

For a fuller understanding of the nature and advantages of the present invention, reference should be made to the following detailed description taken together with the accompanying figures.

BRIEF DESCRIPTION OF THE DRAWING

FIG. 7 is a sectional view of one type of magnetic force microscopy (MFM) probe as an inductive write head for the multilevel magnetic recording system.

FIGS. 8(a) and 8(b) show the two different magnetizations of the probe tip of the MFM probe type inductive head shown in FIG. 7.

DETAILED DESCRIPTION OF THE INVENTION

Patterned Multilevel Perpendicular Magnetic Recording Media

Figure 1:
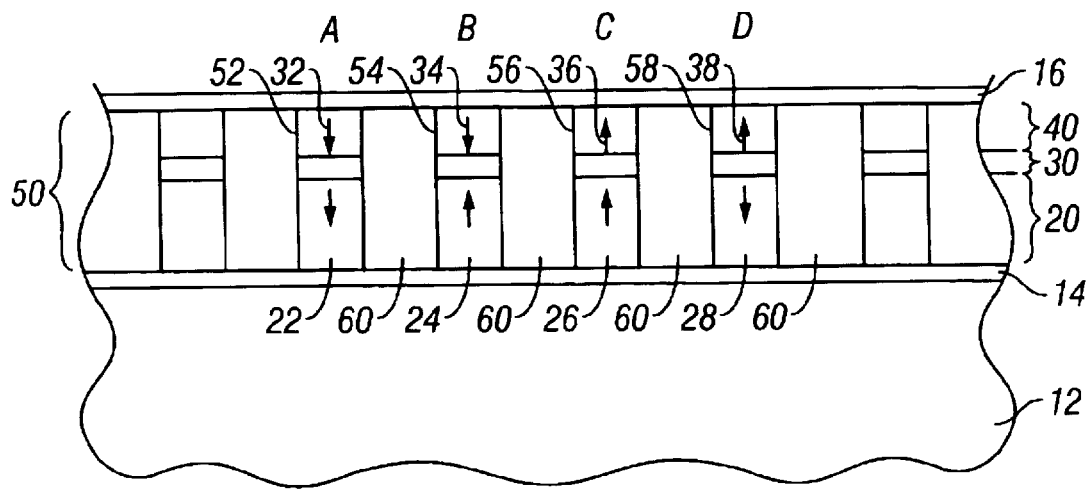
FIG. 1 is a schematic sectional view of the patterned multilevel perpendicular magnetic recording medium according to the present invention.

FIG. 1 is a schematic of the patterned magnetic recording medium according to the present invention. The medium includes a substrate 12, a multilevel perpendicular magnetic recording layer 50, an optional underlayer 14 and optional protective overcoat 16. The recording layer 50 includes a plurality of islands, such as representative islands 52, 54, 56, 58, spaced-apart by spaces 60. Each island is formed of a first layer 20 of magnetic material with perpendicular magnetic anisotropy, a second layer 40 of magnetic material with perpendicular magnetic anisotropy and a spacer layer 30 that separates and magnetically decouples the two magnetic layers 20, 40 in each island. Each island is thus a multilevel magnetic island with at least two stacked magnetically decoupled cells, such as cells 22, 32 in island 52. Each cell is a single magnetic domain and is separated from the other cell in its island by the spacer layer 30 and from the cells in other islands by the regions depicted as spaces 60.

The spaces 60 define the regions between the magnetic islands and are typically formed of nonmagnetic material, but may be formed of ferromagnetic material provided the material does not adversely affect the signal recording and detection from the magnetic islands that they separate. The magnetic islands can be formed by first lithographically patterning the substrate, depositing the layers making up recording layer 50 over the patterned resist and then removing the resist, leaving the magnetic islands. Alternatively, the magnetic islands can be formed by first depositing the layers making up recording layer 50 on the substrate, lithographically patterning the recording layer, etching the recording layer through the lithographic mask, and then removing the resist, leaving the magnetic islands. In both examples, the spaces 60 in the regions between the islands are voids that may be filled with nonmagnetic material, such as alumina or spin-on glass. A substantially planar surface topography can then be formed. The process would involve first forming the magnetic islands, then depositing alumina to a thickness greater than that required to fill the spaces 60, and then polishing the alumina with a chemical-mechanical polish (CMP) process until the magnetic islands were just exposed. This leaves the alumina in the spaces 60 and the tops of the magnetic islands approximately coplanar.

Patterned media may also be fabricated by ion irradiation through a mask to alter the properties of the irradiated regions. In one example of the patterned media ion irradiation fabrication process, the spaces are formed of magnetic material that does not affect the perpendicular magnetic properties of the magnetic islands. For example, the strong perpendicular magnetic anisotropy of Co/Pt multilayers can be destroyed by ion irradiation through holes in a mask to create regions of magnetic material with in-plane magnetization that serve as the spaces between the magnetic islands of non-irradiated Co/Pt multilayers. Ion irradiation methods of fabricating patterned magnetic recording media are described in the following references: C. Chappert, et al., "Planar Patterned Magnetic Media Obtained by Ion Irradiation," *Science*, Vol. 280, Jun. 19, 1998, pp. 1919–922; A. Dietzel et al., "Ion Projection Direct Structuring for Patterning of Magnetic Media", *IEEE Transactions on Magnetics*, Vol. 38, No. 5, September 2002, pp. 1952–1954; U.S. Pat. Nos. 6,331,364 and 6,383,597.

As shown by the representative letters A, B, C, D and the arrows in the cells in FIG. 1 there are four possible magnetic levels or states in each island, each magnetic state depending on the direction of magnetization (magnetic moment) in each magnetic cell. Each magnetic state in the two-layer embodiment of FIG. 1 can thus be represented as a two-bit byte or word. If the cells in the lower layer 20 are selected as the first bit in the byte or word and magnetization in the up direction is considered a 0, then the magnetic states are as follows:

A: [1,1]
B: [0,1]
C: [0,0]
D: [1,0]

FIG. 1 is depicted with two magnetic layers, but 3 or more magnetic layers are possible. The total readback signal integrated over the n different magnetic layers gives rise to $2^n$ different signal levels, which can be used for magnetic recording. The recording density is thus increased by a factor of $2^{(n-1)}$.

For experimentation, a magnetic thin film was sputter-deposited at room temperature onto an hexagonal array of $SiO_2$ pillars with a diameter of 150 nm and a height of 80 nm. The spacing between the center of the pillars was 300 nm. The pillars were formed by lithographically patterning a $SiO_2$ film formed on a Si substrate. The structure had two perpendicular Co/Pd multilayers separated by a 5 nm thick Pd layer to magnetically decouple the upper and lower multilayers. The composition of the film was as follows:

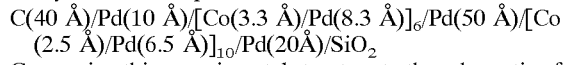

Comparing this experimental structure to the schematic of FIG. 1, the multilayer of 10 Co/Pd pairs is the lower magnetic layer 20, the multilayer of 6 Co/Pd pairs is the upper magnetic layer 40, and the 5 nm thick Pd layer is the spacer layer 30. The strength of the magnetic anisotropy and coercivity of the magnetic layers can be easily altered by changing the Co and Pd thicknesses. In this structure all of the layers making up layers 20, 30 and 40 were also deposited into the regions or "trenches" in the $SiO_2$ between the pillars of $SiO_2$. However, because of the depth of these layers relative to the magnetic islands on top of the pillars, the magnetic properties of the islands are not affected by the magnetic material in the trenches and there are thus voids between the magnetic islands.

Figure 2:
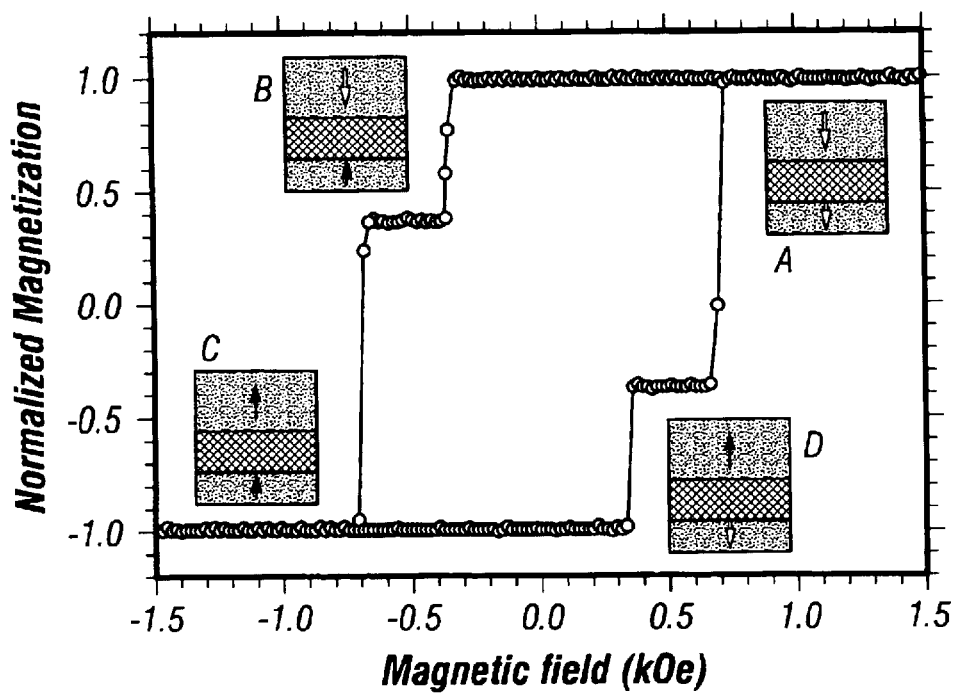
FIG. 2 is a magneto-optical Kerr effect (MOKE) hysteresis loop of an unpatterned section of the magnetic recording medium showing schematic representations of the four possible magnetization levels (labeled as A, B, C, and D) of the cells in a magnetic island.

Magneto-optical Kerr effect (MOKE) hysteresis measurements on a continuous unpatterned section of this structure revealed the distinct switching of each Co/Pd multilayer at different applied fields, as shown in FIG. 2. To confirm that magnetic interaction through magnetostatic coupling between the two magnetic layers was negligible, minor loops were also measured to determine the coupling field, but no indication of coupling was found. Therefore the hysteresis loop shape can be simply understood as a superposition of the hysteresis of two independent magnetic layers. FIG. 2 also shows that the $[Co(2.5 \text{ Å})/Pd(6.5 \text{ Å})]_{10}$ multilayer (lower layer) has a coercivity of approximately 350 Oe and the $[Co(3.3 \text{ Å})/Pd(8.3 \text{ Å})]_6$ multilayer (upper layer) has a coercivity of approximately 700 Oe.

A magnetic recording experiment was also performed on this island array structure. The structure was fixed on a x-y stage, controlled by piezoelectric drivers with a resolution of less than 2 nm, and scanned at low velocity (approximately 5 μm/s) while in physical contact with the recording head. A conventional longitudinal recording giant magnetoresistive (GMR) read/write head was used with write and read head widths of about 240 nm and 180 nm, respectively. The structure was first dc magnetized in an external perpendicular field of 20 kOe. The recording head was then aligned parallel to the rows of magnetic islands. Although a conventional longitudinal inductive write head generates a write field between its poles that is generally in the plane of the media, in this experiment the perpendicular components of the fringing field from the poles were used to change the magnetization of the perpendicularly magnetized cells in the islands.

Figure 3:
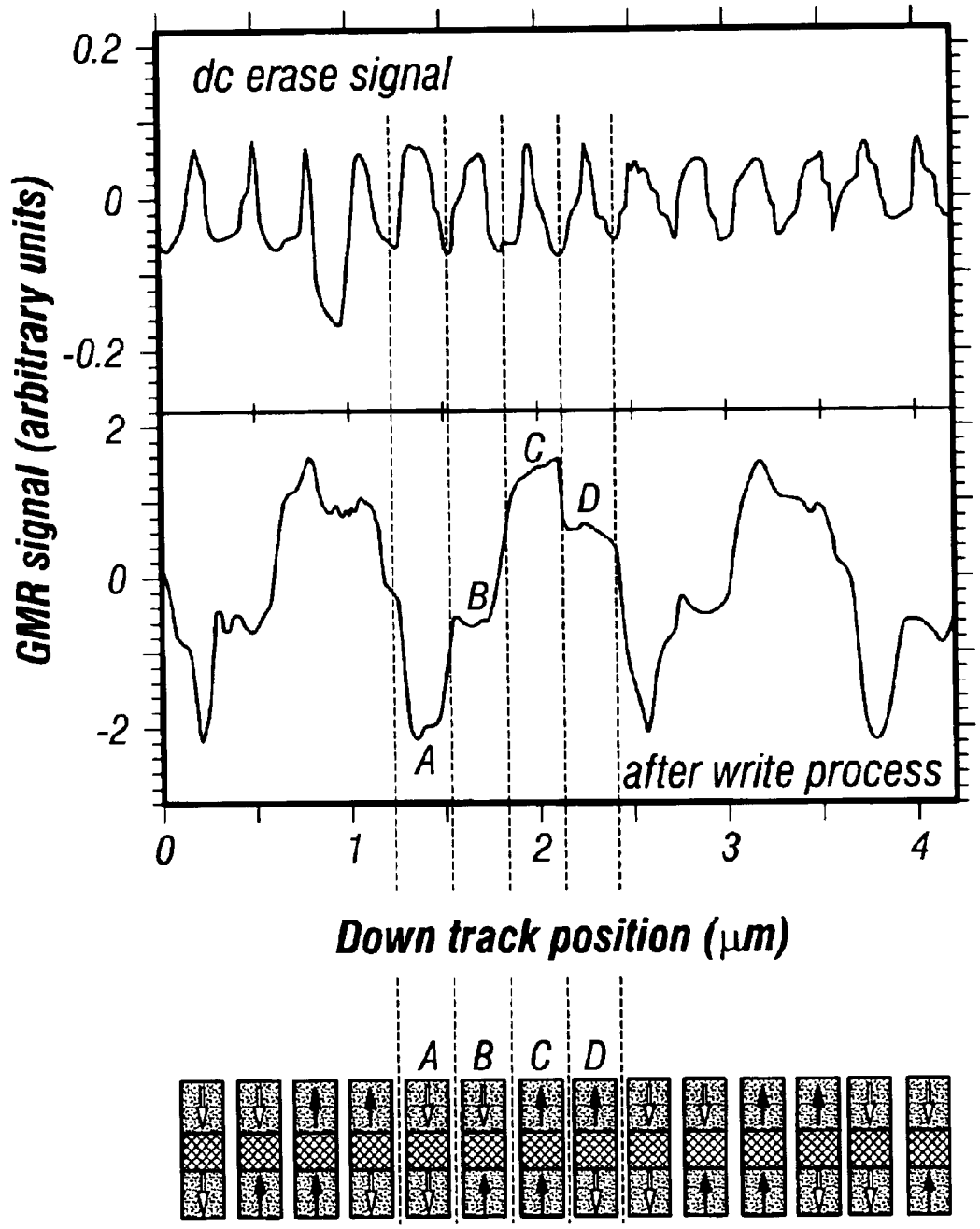
FIG. 3 is a readback signal of the patterned multilevel media after dc magnetizing the sample (top) and after applying a square wave write pattern (middle), and showing a schematic representation of the cell magnetizations corresponding to the readback signal (bottom).
Figure 4A:
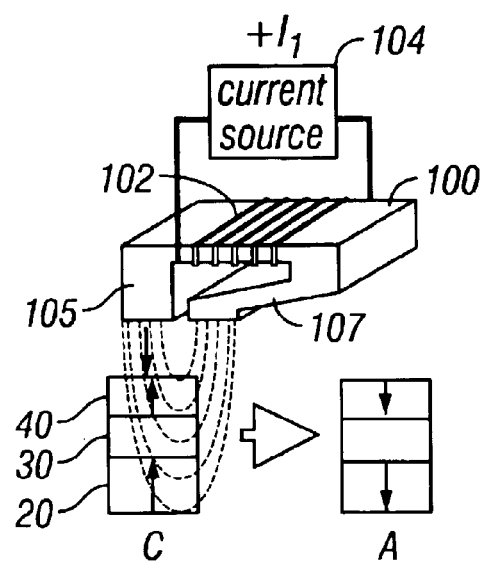
FIG. 4 is a schematic illustrating the method in which an inductive write head writes the four different magnetization levels in a magnetic island of the patterned multilevel media.
Figure 4C:
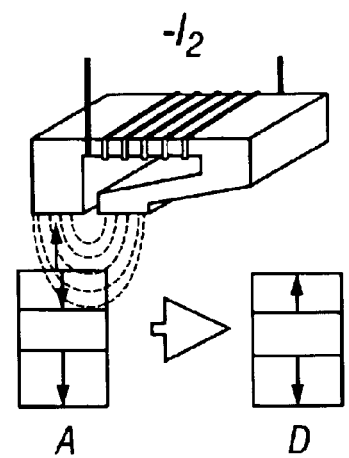
Figure 4B:
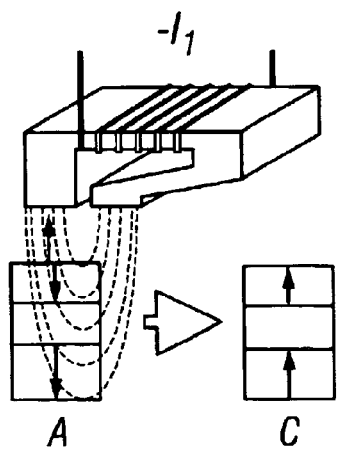
Figure 4D:
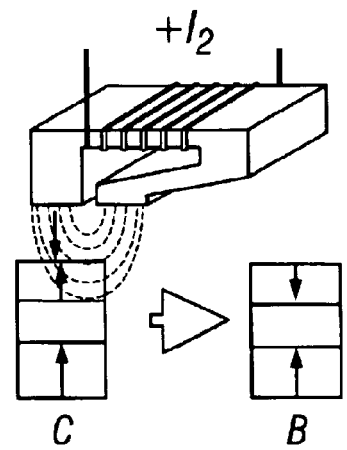
Figure 5A:
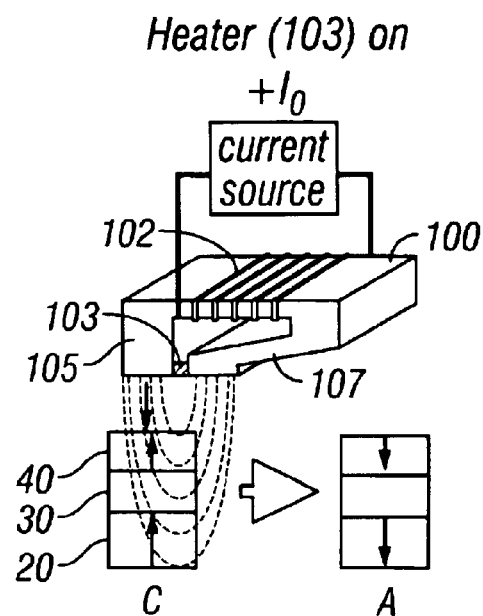
FIG. 5 is a schematic illustrating the method in which an inductive write head with an electrically resistive heater writes the four different magnetization levels in a magnetic island of the patterned multilevel media.
Figure 5C:
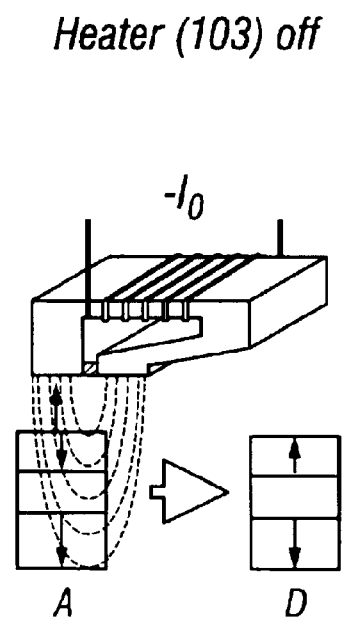
Figure 5B:
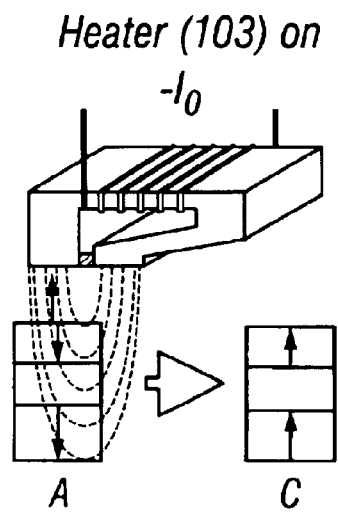
Figure 5D:
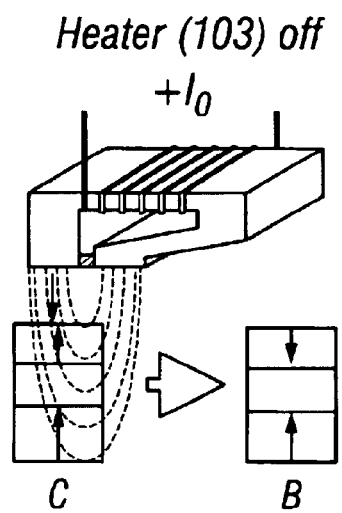

In contrast to writing on conventional continuous media, where the bits can be written everywhere on the medium, writing on patterned media requires the synchronization of the square wave write pattern with the island pattern. The island locations can be easily retrieved from the readback signal of the dc-erased magnetized islands, where the minima indicate the trenches or spaces separating the islands, as shown by the top signal in FIG. 3. The read head width of about 180 nm enables the signal to be read back from an individual island in the array. In this experimental example, a horizontal write head was used with a fixed write current of 40 mA. Even though a fixed write current was used, by proper timing of the write pulses it was possible to apply the fringing field with a strength less than maximum to an island so that only the cell with the lower coercivity in that island had its magnetization switched. Timing of the write pulses so that the maximum fringing field was applied resulted in switching the magnetizations of both cells in an island. All four magnetic states (A,B,C,D) were able to be written in this manner. The bottom signal in FIG. 3 shows the readback waveform generated by dragging the GMR read head across the island patterns and reveals the four different magnetization levels (A,B,C,D).

The experimental results described above were for a multilevel magnetic recording medium wherein the magnetic cells with perpendicular magnetic anisotropy were multilayers of alternating Co/Pd layers. Co/Pt multilayers may also be used. The invention is also fully applicable with other types of magnetic recording materials and structures that provide perpendicular magnetic anisotropy.

The magnetic cells can be formed of a granular polycrystalline cobalt-chromium (CoCr) alloy grown on a special growth-enhancing sublayer that induces the crystalline C-axis to be perpendicular to the plane of the layer, so that the layer has strong perpendicular magnetocrystalline anisotropy. Materials that may be used as the growth-enhancing sublayer for the CoCr granular layer include Ti, TiCr, C, NiAl, $SiO_2$ and CoCr, where Cr is about 35–40 atomic percent.

The magnetic cells can also be formed any of the known amorphous materials that exhibit perpendicular magnetic anisotropy, such as CoSm, TbFe, TbFeCo, and GdFe alloys.

The magnetic cells can also be formed of chemically ordered CoPt, CoPd, FePt, FePd, $CoPt_3$ or $CoPd_3$. Chemically-ordered alloys of CoPt, CoPd, FePt or FePd, in their bulk form, are known as face-centered tetragonal (FCT) $L1_0$-ordered phase materials (also called CuAu materials). They are known for their high magnetocrystalline anisotropy and magnetic moment. The c-axis of the $L1_0$ phase is the easy axis of magnetization and is oriented perpendicular to the substrate, thus making the material suitable for perpendicular magnetic recording media. Like the Co/Pt and Co/Pd multilayers, these layers have very strong perpendicular anisotropy.

While Pd was used as the spacer layer material in the example described above, essentially any nonmagnetic material can be used, provided it is thick enough to assure that the magnetic cells in the islands are magnetically decoupled. Cu, Ag, Au and Ru are examples of other materials that may be used for the spacer layer.

In perpendicular magnetic recording systems that use pole heads for reading and writing, a "soft" magnetically permeable underlayer is often used on the substrate beneath the magnetic layer to provide a flux return path for the field from the read/write pole head. In perpendicular magnetic recording systems that use ring heads for reading and writing, a soft underlayer may not be necessary. Alloy materials that are suitable for the soft underlayer include NiFe, FeAlSi, FeTaN, FeN, CoFeB and CoZrNb.

Method for Recording on the Multilevel Media Using Variable Write Current

FIG. 4 illustrates the manner in which the inductive write head 100 records each of the four possible magnetic states in a magnetic island having two single domain magnetic cells. The head 100 is a perpendicular head and has a coil 102 connected to a current source 104. The current source 104 is part of the write driver circuitry that also includes switching circuitry to generate bi-directional write pulses with at least two different current levels, $I_1$ and $I_2$. The write current generates a generally perpendicular magnetic field from the write pole 105 that returns back to the return pole 107. In the preferred embodiment of a two-layer medium, the lower magnetic layer 20 has a higher coercivity than the upper magnetic layer 40. Current level $I_1$ generates a magnetic write field greater than the coercivity of the lower layer 20. Thus, as shown in FIG. 4(a) a positive $I_1$ changes the magnetization direction in both layers 20, 40 and generates the A state. Similarly, as shown in FIG. 4(b), a negative $I_1$ write pulse changes the magnetization direction in both layers 20, 40 and generates the C state. To generate the D state, the island must first be in the A state, after which a second current pulse with a value of $I_2$ in the "negative" direction is applied, as shown in FIG. 4(c). This negative $I_2$ current pulse generates a magnetic write field greater than the coercivity of the upper layer 40 but less than the coercivity of the lower layer 20 so only the magnetization of only the upper layer 40 is switched. Similarly, to generate the B state, the island must first be in the C state, after which a second current pulse with a value of $I_2$ in the "positive" direction is applied, as shown in FIG. 4(d). This positive $I_2$ current pulse generates a magnetic write field greater than the coercivity of the upper layer 40 but less than the coercivity of the lower layer 20 so only the magnetization of the upper layer 40 is switched. A substantial difference in coercivity between the magnetic layers assures that only the upper cell in the magnetic island is switched when the $I_2$ pulse is applied. However, the coercivities in the two cells in an island can be very close or the coercivity of the lower cell only slightly greater than the coercivity of the upper cell if the media is designed so that the lower cell is sufficiently far from the upper cell. For example, by appropriate selection of the thickness of the spacer layer 30, the lower layer 40 will be exposed to a much lower write field than the upper layer 20 when the $I_2$ pulse is applied.

Method for Recording on the Multilevel Media Using Thermal Assistance and Fixed Write Current FIG. 5 illustrates the manner in which a thermally-assisted inductive write head 100' records each of the four possible magnetic states in a magnetic island having two single domain magnetic cells. The head 100' is a perpendicular head and has a coil 102 connected to a current source 104 that provides a fixed write current $I_0$. The current source 104 is part of the write driver circuitry that also includes switching circuitry to generate bi-directional write pulses with plus or minus current levels, $I_0$. The head 100' also includes an electrically resistive heater 103 located between the write pole 105 and the return pole 107. The heater 103 is connected to circuitry for applying current pulses that enable the heater 103 to generate heat pulses to the magnetic islands on the medium. U.S. Pat. No. 6,493,183 describes an inductive write head for generating the magnetic write field and a heater for heating the media. The write current $I_0$ generates a generally perpendicular magnetic field from the write pole 105 that returns back to the return pole 107. In the preferred embodiment of a two-layer medium, the lower magnetic layer 20 has a higher coercivity than the upper magnetic layer 40. Current level $I_0$ generates a magnetic write field greater than the coercivity of the upper layer 40 but less than the coercivity of the lower layer 20. Thus without thermal assistance from heater 103, only the magnetization of the cells in upper layer 40 will be switched by the magnetic write field. However, when heat is applied to the medium from heater 103 the temperature of the lower layer 20 is raised close to the Curie temperature of the ferromagnetic material in the lower layer 20, which reduces the coercivity of the lower layer 20 to below the write field generated by current $I_0$. Thus, as shown in FIG. 5(*a*) a positive $I_0$ current pulse in combination with a heat pulse from heater 103 changes the magnetization direction in both layers 20, 40 and generates the A state. Similarly, as shown in FIG. 5(*b*), a negative $I_0$ current pulse in combination with a heat pulse from heater 103 changes the magnetization direction in both layers 20, 40 and generates the C state. To generate the D state, the island must first be in the A state, after which a negative $I_0$ current pulse is applied, as shown in FIG. 5(*c*). This negative $I_0$ current pulse generates a magnetic write field greater than the coercivity of the upper layer 40 but less than the coercivity of the lower layer 20 so only the magnetization of the upper layer 40 is switched. Similarly, to generate the B state, the island must first be in the C state, after which a positive $I_0$ current pulse is applied, as shown in FIG. 5(*d*). This positive $I_0$ current pulse generates a magnetic write field greater than the coercivity of the upper layer 40 but less than the coercivity of the lower layer 20 so only the magnetization of the upper layer 40 is switched. A substantial difference in coercivity between the magnetic layers assures that only the upper cell in the magnetic island is switched when the $I_0$ pulse is applied. However, the coercivities in the two cells in an island can be very close or the coercivity of the lower cell only slightly greater than the coercivity of the upper cell if the media is designed so that the lower cell is sufficiently far from the upper cell. For example, by appropriate selection of the thickness of the spacer layer 30, the lower layer 40 will be exposed to a much lower write field than the upper layer 20 when the $I_0$ pulse is applied. As one example of this embodiment, the lower layer can be formed of a 6 [Co(4 Å)/Pd(10 Å)] multilayer and have a coercivity of approximately 3000 Oe, and the upper layer can be formed of a 6 [Co(2.5 Å)/Pd(5 Å)] multilayer and have a coercivity of approximately 2000 Oe. A fixed write current pulse of 10 mA will generate a magnetic write field of approximately 3000 Oe. A heat pulse of a few milliwatts will increase the temperature of both layers by approximately 40 K, which will reduce the coercivity of the lower layer to approximately 1000 Oe.

Although FIG. 5 shows the heater 103 located between the poles 105, 107, the heater may also be located on either side of a pole. Also, the heater may be formed as part of the coil of a longitudinal write head, as described in published U.S. Patent Application 2003/0021191A1, in which case portions of the coil serve as the electrical leads to the heater. In addition, the heater does not need to be an electrically resistive heater and may be a separate element not directly associated with the inductive write head, such as a laser that directs a light spot to the medium, provided the heat pulse and the magnetic write field can be localized to assure that only the desired cells have their magnetizations switched.

Figure 6:
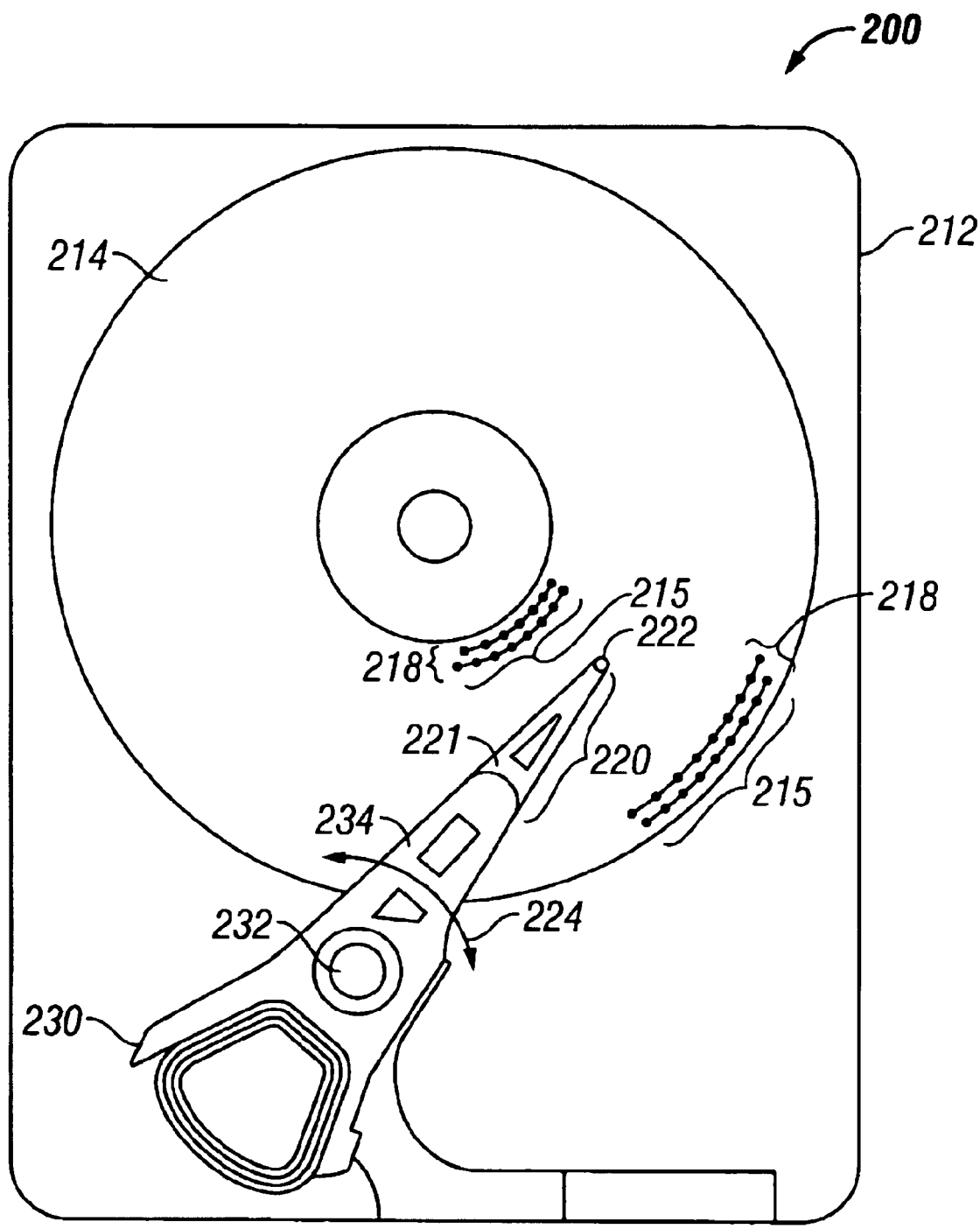
FIG. 6 is a top view of a disk drive embodiment of the multilevel magnetic recording system showing the magnetic islands as dots on concentric tracks of the recording disk.

FIG. 6 is a top view of a disk drive embodiment of the multilevel magnetic recording system according to the present invention. The drive 200 has a housing or base 212 that supports an actuator 230 and a drive motor for rotating the multilevel magnetic recording disk 214. The disk 214 substrate may be any suitable substrate, such as the glass or aluminum-magnesium (AlMg) substrates used in conventional disk drives. The actuator 230 may be a voice coil motor (VCM) rotary actuator that has a rigid arm 234 and rotates about pivot 232 as shown by arrow 224. A head-suspension assembly 220 includes a suspension 221 that has one end attached to the end of actuator arm 234 and a head carrier 222, such as an air-bearing slider, attached to the other end of suspension 221. The magnetic islands 215 on disk 214 are arranged in radially-spaced circular tracks 218. As the disk 214 rotates, the movement of actuator 230 allows the head 100 on the trailing end of head carrier 222 to access different data tracks 218 on disk 214 for the recording of multilevel data in the magnetic islands 215. As previously mentioned, the writing on patterned media requires the synchronization of the write pulses with the island pattern. A patterned media magnetic recording system that uses the magnetic islands to clock the writing is described in published application US20030107833A1 titled "Patterned media magnetic recording disk drive with timing of write pulses by sensing the patterned media" published Jun. 12, 2003 and assigned to the same assignee as the present application.

The inductive write head used to record the signal shown in FIG. 3 was a conventional longitudinal inductive write head, and the inductive write head depicted in FIG. 4 is a perpendicular head with a write pole and a return pole. Another type of inductive write head for use in the present invention is based on a magnetic-force-microscopy (MFM) probe comprising a cantilever with a nanometer-sharp magnetic tip at the cantilever end. One type of MFM probe is described in U.S. Pat. No. 5,900,729 and shown in FIG. 6. FIG. 7 is a side sectional view of the probe 300 showing the probe body 310 attached to cantilever 350. The probe body 310 has a pair of poles 340, 342 and an inductive coil 311. The coil 311 and poles 340, 342 are formed using conventional lithographic techniques, as is well known in the manufacture of disk drive thin film inductive write heads in which the coil and poles are formed on the trailing end of a conventional disk dbrive air-bearing slider. The poles 340, 342 are spaced apart by a nonmagnetic gap 314. The poles 340, 342 are interconnected to form a yoke through which the coil 311 passes. The sectioned ends of the coil windings are shown in end view as coil 311. When current passes through coil 311, a magnetic field is induced in the yoke and magnetic flux is generated between the poles 340, 342 just as in a conventional longitudinal thin film inductive write head. A probe tip 320, which is formed in contact with at least one of the poles 340 or 342 and preferably also in contact with the end surface of the gap 314, extends from the ends of the poles. The probe tip 320 has at least one surface or side 322 which is in contact with one of the poles and is formed of a magnetic material. The probe tip 320 is shown as having a generally conical shape, but its actual shape can vary. As an alternative to the yoke structure depicted in FIG. 7, the coil may be wrapped in a helical manner around probe tip 320, the probe body 310, or the cantilever 350 provided these structures are formed of material that allows the magnetic field generated by the coil to be directed to the magnetic probe tip 320. This type of MFM probe is described in U.S. Pat. No. 5,436,448. In any such arrangement using an MFM probe as the inductive write head, the coil receives current $I_1$ or $I_2$ from the write driver, which causes probe tip 320 to be magnetized in one direction with a field strength determined by the value of $I_1$ or $I_2$. When the current direction is switched through the coil, the direction of magnetization of the probe tip is reversed. These two magnetization directions are shown schematically in FIGS. 8(a)–8(b). These two possible magnetization directions and two possible magnetic field values enable the four possible magnetic states (A, B, C, D) to be written in the magnetic islands in the same manner as described with respect to FIG. 4.

Figure 9:
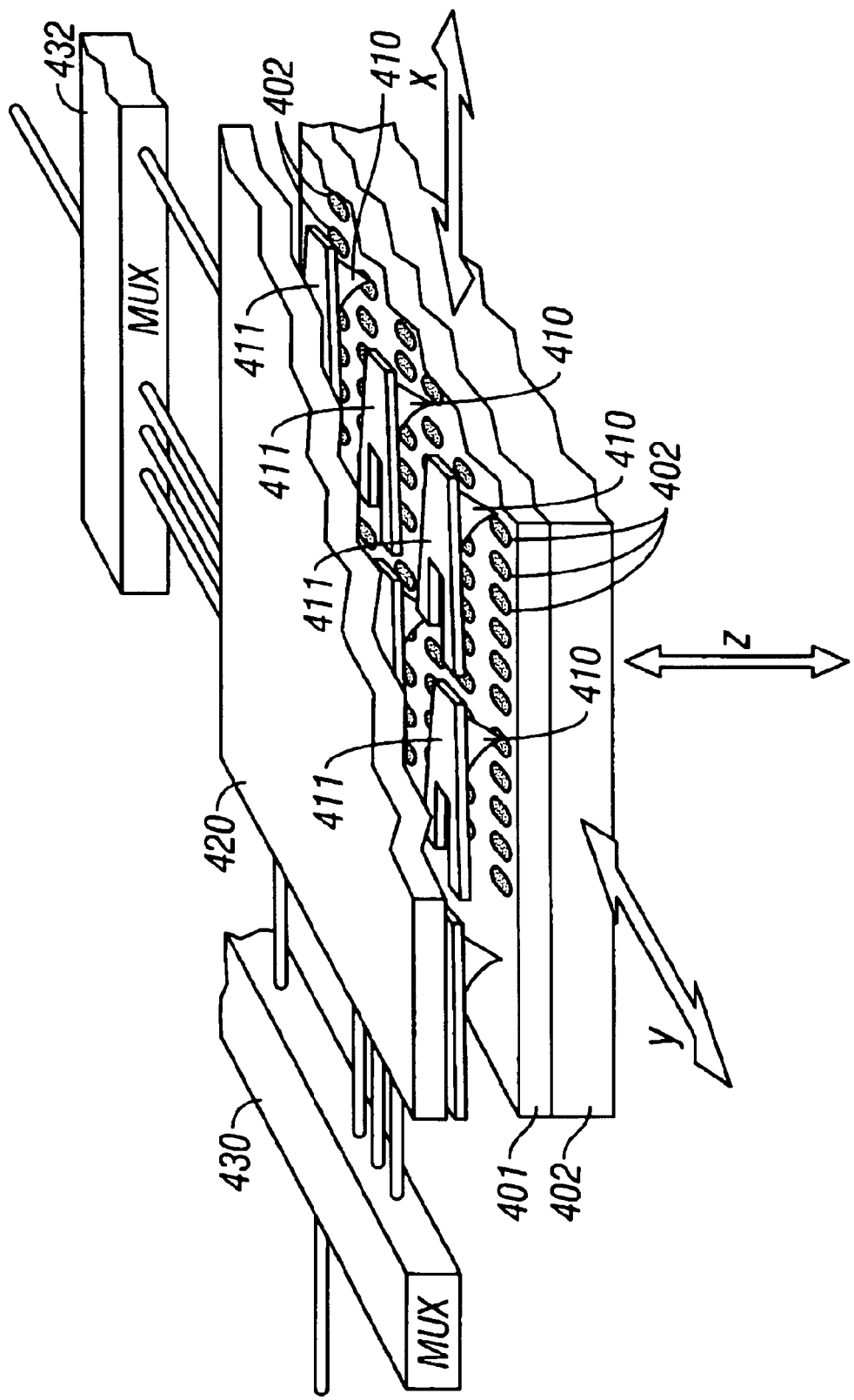
FIG. 9 is a view of a scanning probe embodiment of the multilevel magnetic recording system showing an x-y array of MFM probe inductive write heads and the media substrate with the magnetic islands arranged as an x-y array, the islands being represented as dots.

In the disk drive embodiment of the present invention with the MFM probe as the inductive write head, the cantilever 350 with probe tip 320 is attached to the actuator arm 234 (FIG. 5). Another type of actuator that enables the MFM probe to be used in a disk drive is described in U.S. Pat. No. 5,804,710. However, the MFM probe type of inductive write head also permits multilevel magnetic recording in a scanning probe system. A scanning probe system is described in "Millipede-A MEMS-Based Scanning-Probe Data-Storage System", *IEEE Transactions on Magnetics*, Vol. 39, No. 2, March 2003, pp. 938–945. The "Millipede" system is a thermomechanical system in which the data is recorded by heating the probe tips to cause pits in a polymeric storage medium. The scanning probe embodiment of the multilevel magnetic recording system according to the present invention is shown in FIG. 9. The multilevel magnetic recording medium 400 is as described with respect to FIG. 1 and includes the substrate 401 and the magnetic islands 402. The islands 402 are arranged as an x-y array of mutually perpendicular rows on the substrate 401. The substrate 401 is supported on a platform 402 of an xyz scanner. An array of MFM type probe tips 410 with associated cantilevers 411 is fabricated on a chip 420. The chip 420 and medium 400 are movable relative to one another in the x-y directions by the xyz scanner. Thus each probe is associated with only a section of the total island array and addresses only the islands in that section. Multiplex drivers (MUX) 430, 432 allow write currents $I_1$, $I_2$ to be delivered to each MFM probe individually.

The scanning probe system described above and depicted in FIG. 9 has an array of probes. However, the scanning probe multilevel magnetic recording system according to the present invention is also possible with only a single probe in cooperation with an xyz scanner, in the manner of a conventional MFM system.

While the present invention has been particularly shown and described with reference to the preferred embodiments, it will be understood by those skilled in the art that various changes in form and detail may be made without departing from the spirit and scope of the invention. Accordingly, the disclosed invention is to be considered merely as illustrative and limited in scope only as specified in the appended claims.

What is claimed is:

1. A magnetic recording medium comprising:
   a substrate; and
   a plurality of spaced-apart magnetic islands on the substrate, each island comprising at least two stacked magnetic cells, each cell having perpendicular magnetic anisotropy and being separated from the other cells in its island.

2. The medium of claim 1 wherein the magnetic moments of each of two neighboring cells in an island are oriented either parallel or antiparallel.

3. The medium of claim 1 wherein each cell is a single magnetic domain.

4. The medium of claim 3 wherein each cell has a magnetic moment oriented in one of two opposite directions substantially perpendicular to the substrate.

5. The medium of claim 1 wherein each island includes a layer of nonmagnetic material between the stacked cells for separating the cells.

6. The medium of claim 1 wherein the islands are spaced apart by voids.

7. The medium of claim 6 wherein the substrate is patterned into a plurality of pillars and wherein the islands are formed on the pillars.

8. The medium of claim 1 wherein the islands are spaced apart by spacing material formed on the substrate between the islands and having substantially no perpendicular magnetic anisotropy.

9. The medium of claim 8 wherein the spacing material is nonmagnetic.

10. The medium of claim 1 wherein there are only two cells in each island.

11. The medium of claim 1 wherein each cell is a multilayer of alternating layers of a first material selected from the group consisting of Co and Fe and a second material selected from the group consisting of Pt and Pd, said multilayer having magnetic anisotropy substantially perpendicular to the substrate.

12. The medium of claim 1 wherein each cell is formed of a ferromagnetic material comprising one or more of Co, Ni, Fe and alloys thereof.

13. The medium of claim 12 wherein each cell is formed of a ferromagnetic material comprising an alloy of Co and Cr having a magnetocrystalline anisotropy substantially perpendicular to the substrate.

14. The medium of claim 13 wherein each cell is formed directly on a growth enhancing sublayer.

15. The medium of claim 14 wherein the growth enhancing sublayer is formed of a material selected from the group consisting of Ti, TiCr, C, NiAl, SiO$_2$ and CoCr, where Cr is about 35–40 atomic percent in the CoCr sublayer.

16. The medium of claim 1 wherein the cell closest to the substrate in each island has a magnetic coercivity greater than the magnetic coercivity of the other cells in its island.

17. The medium of claim 1 further comprising an underlayer on the substrate beneath the islands.

18. The medium of claim 17 wherein the underlayer is a soft magnetically permeable underlayer of material selected from the group consisting of NiFe, FeAlSi, FeTaN, FeN, CoFeB and CoZrNb.

19. The medium of claim 1 wherein the islands are arranged on the substrate in a plurality of generally concentric circular tracks.

20. The medium of claim 1 wherein the islands are arranged on the substrate in an array of mutually perpendicular rows.

21. A patterned magnetic recording medium comprising a substrate and a plurality of spaced-apart magnetic islands on the substrate, each island comprising at least two stacked magnetic cells, each cell having (a) magnetic anisotropy substantially perpendicular to the substrate, (b) a magnetic moment substantially decoupled from the magnetic moments of neighboring cells in its island, and (c) a magnetic coercivity different from the coercivities of neighboring cells in its island.

22. The medium of claim 21 wherein each island further comprises a spacer layer between neighboring cells for decoupling the magnetic moments of neighboring cells.

23. The medium of claim 21 wherein the islands are spaced apart by voids.

24. The medium of claim 23 wherein the substrate is patterned into a plurality of pillars and wherein the islands are formed on the pillars.

25. The medium of claim 21 wherein the islands are spaced apart by spacing material formed on the substrate between the islands and having substantially no perpendicular magnetic anisotropy.

26. The medium of claim 25 wherein the spacing material is nonmagnetic.

27. The medium of claim 21 wherein there are only two cells in each island.

28. The medium of claim 21 wherein each cell is a multilayer of alternating layers of a first material selected from the group consisting of Co and Fe and a second material selected from the group consisting of Pt and Pd, said multilayer having magnetic anisotropy substantially perpendicular to the substrate.

29. The medium of claim 21 wherein each cell is formed of a ferromagnetic material comprising one or more of Co, Ni, Fe and alloys thereof.

30. The medium of claim 29 wherein each cell is formed of a ferromagnetic material comprising an alloy of Co and Cr having magnetocrystalline anisotropy substantially perpendicular to the substrate.

31. The medium of claim 30 wherein each cell is formed directly on a growth enhancing sublayer.

32. The medium of claim 31 wherein the growth enhancing sublayer is formed of a material selected from the group consisting of Ti, TiCr, C, NiAl, SiO$_2$ and CoCr, where Cr is about 35–40 atomic percent in the CoCr sublayer.

33. The medium of claim 21 further comprising an underlayer on the substrate beneath the islands.

34. The medium of claim 21 wherein the underlayer is a soft magnetically permeable underlayer of material selected from the group consisting of NiFe, FeAlSi, FeTaN, FeN, CoFeB and CoZrNb.

35. The medium of claim 21 wherein the medium is a disk and the islands are arranged on the substrate in a plurality of generally concentric circular tracks.

36. The medium of claim 21 wherein the islands are arranged on the substrate in an array of mutually perpendicular rows.

* * * * *

UNITED STATES PATENT AND TRADEMARK OFFICE
CERTIFICATE OF CORRECTION

PATENT NO. : 6,947,235 B2 Page 1 of 1
DATED : September 20, 2005
INVENTOR(S) : Manfred Albrecht et al.

It is certified that error appears in the above-identified patent and that said Letters Patent is hereby corrected as shown below:

Column 12,
Line 27, delete the numeral "21" and replace with the numeral -- 33 --.

Signed and Sealed this

Fifteenth Day of November, 2005

JON W. DUDAS
*Director of the United States Patent and Trademark Office*